United States Patent
Kaku et al.

[11] Patent Number: 6,052,037
[45] Date of Patent: Apr. 18, 2000

[54] MODULATION METHOD AND APPARATUS

[75] Inventors: Takashi Kaku; Hideo Miyazawa, both of Kawasaki, Japan

[73] Assignee: Fujitsu Limited, Kanagawa, Japan

[21] Appl. No.: 09/209,235

[22] Filed: Dec. 10, 1998

[30] Foreign Application Priority Data

Jan. 9, 1998 [JP] Japan .................................. 10-003088

[51] Int. Cl.[7] ............................... H03C 3/00; H03K 7/00; H04L 27/00
[52] U.S. Cl. .......................... 332/100; 332/103; 332/107; 375/223; 375/296
[58] Field of Search ...................... 332/100–103, 332/107, 123, 159; 375/296, 222, 298, 223, 302, 308; 455/22, 43, 63; 379/93.28

[56] References Cited

U.S. PATENT DOCUMENTS

| | | | |
|---|---|---|---|
| 4,672,633 | 6/1987 | Claasen et al. ............................ | 375/58 |
| 5,783,974 | 7/1998 | Koslov et al. ........................... | 332/103 |
| 5,815,046 | 9/1998 | Spilker, Jr. et al. .................... | 332/103 |
| 5,930,301 | 7/1999 | Chester et al. ......................... | 375/296 |

*Primary Examiner*—David Mis
*Attorney, Agent, or Firm*—Helfgott & Karas, P.C.

[57] ABSTRACT

Disclosed is a modulation method in which the frequency band of a transmission signal, consisting of signal points generated at a given modulation rate in accordance with transmission data, is shifted by a desired frequency shift amount, and which is capable of lowering carrier frequency without increasing the amount of computation. The modulation method includes the steps of (a) shifting the frequency band of the transmission signal by a first frequency shift amount, (b) low-pass filtering an output signal resulting from the step (a) in order to limit the output signal to a frequency band containing baseband and equivalent to an integral multiple of the modulation rate, and (c) shifting the frequency band of an output signal resulting from the step (b) by a second frequency shift amount equivalent to an integral submultiple of a sampling frequency, wherein the first frequency shift amount is set so that the sum of the first frequency shift amount and the second frequency shift amount is equal to the desired frequency shift amount.

11 Claims, 9 Drawing Sheets

| BLOCK METHOD | CARRIER SHIFTER | L P F | MODULATOR | LPF & MODULATOR | TOTAL | REMARKS |
|---|---|---|---|---|---|---|
| PRIOR ART | 0 | 206 | 20 | — | 226 | NUMBER OF TAPS: 99 |
| PRESENT INVENTION | 8 | — | — | 64 | 72 | NUMBER OF TAPS: 119 |

Fig.9

MODULATION METHOD AND APPARATUS

BACKGROUND OF THE INVENTION

1. Field of the Invention

The present invention relates to a modulation method and apparatus applicable, for example, to an in-building modem used for communications within a building, or a wideband modem used for wide area communications, in the field of data communications.

2. Description of the Related Art

Traditionally, modulation for data communications is accomplished by implementing, within a digital signal processor (DSP), a signal point generator for generating signal points (symbols) representing transmission data, a low-pass filter (also called a waveshaping filter, roll-off filter, etc.) for performing interpolation while limiting signal frequency band, and a modulator for shifting the signal frequency band from baseband to passband using a carrier. In the signal processing, computations using complex vectors are carried out.

In recent years, the need for long-distance transmission using an in-building modem or a wideband modem has been growing. In long-distance transmission using an in-building modem or a wideband modem, it is required that the carrier frequency be set as low as possible to reduce signal attenuation and minimize energy loss at high frequencies. Furthermore, since the modulation rate increases with increasing modem speeds, the amount of computation must be reduced accordingly.

However, with prior known modulation methods, if it is attempted to simply lower the carrier frequency, the negative portion of the signal frequency spectrum is folded into the positive side at the instant that conversion is made from a vector signal (complex number) to a scalar signal (real number) for output onto a transmission line; in this case, there is the possibility that the folded portion may overlap into the baseband, causing noise and resulting in signal degradation. To subdue the noise caused by the overlapping (aliasing noise), the roll-off factor of the low-pass filter must be decreased, but if the roll off factor is decreased, the amount of computation in the DSP increases.

SUMMARY OF THE INVENTION

In view of the above situation, it is an object of the present invention to provide a modulation method and apparatus capable of lowering the carrier frequency without increasing the amount of computation.

To achieve the above object, according to the present invention, there is provided a modulation method in which the frequency band of a transmission signal, consisting of signal points generated at a given modulation rate in accordance with transmission data, is shifted by a desired frequency shift amount, comprising the steps of: (a) shifting the frequency band of the transmission signal by a first frequency shift amount; (b) low-pass filtering an output signal resulting from the step (a) in order to limit the output signal to a frequency band containing a baseband and equivalent to an integral multiple of the modulation rate; and (c) shifting the frequency band of an output signal resulting from the step (b) by a second frequency shift amount equivalent to an integral submultiple of a sampling frequency, and wherein the first frequency shift amount is set so that the sum of the first frequency shift amount and the second frequency shift amount is equal to the desired frequency shift amount.

According to the present invention, there is also provided a modulation apparatus for shifting by a desired frequency shift amount the frequency band of a transmission signal consisting of signal points generated at a given modulation rate in accordance with transmission data, comprising: first frequency shifting means for shifting the frequency band of the transmission signal by a first frequency shift amount; a low-pass filter for limiting an output signal of the first frequency shifting means to a frequency band containing a baseband and equivalent to an integral multiple of the modulation rate; and second frequency shifting means for shifting the frequency band of an output signal of the low-pass filter by a second frequency shift amount equivalent to an integral submultiple of a sampling frequency, and wherein the first frequency shift amount is set so that the sum of the first frequency shift amount and the second frequency shift amount is equal to the desired frequency shift amount.

According to the present invention, there is also provided a modem equipped with a modulation apparatus for shifting by a desired frequency shift amount the frequency band of a transmission signal consisting of signal points generated at a given modulation rate in accordance with transmission data, the modulation apparatus comprising: first frequency shifting means for shifting the frequency band of the transmission signal by a first frequency shift amount; a low-pass filter for limiting an output signal of the first frequency shifting means to a frequency band containing baseband and equivalent to an integral multiple of the modulation rate; and second frequency shifting means for shifting the frequency band of an output signal of the low-pass filter by a second frequency shift amount equivalent to an integral submultiple of a sampling frequency, and wherein the first frequency shift amount is set so that the sum of the first frequency shift amount and the second frequency shift amount is equal to the desired frequency shift amount.

BRIEF DESCRIPTION OF THE DRAWINGS

Further features and advantages of the present invention will be apparent from the following description with reference to the accompanying drawings, in which.

DESCRIPTION OF THE PREFERRED EMBODIMENTS

Figure 1:
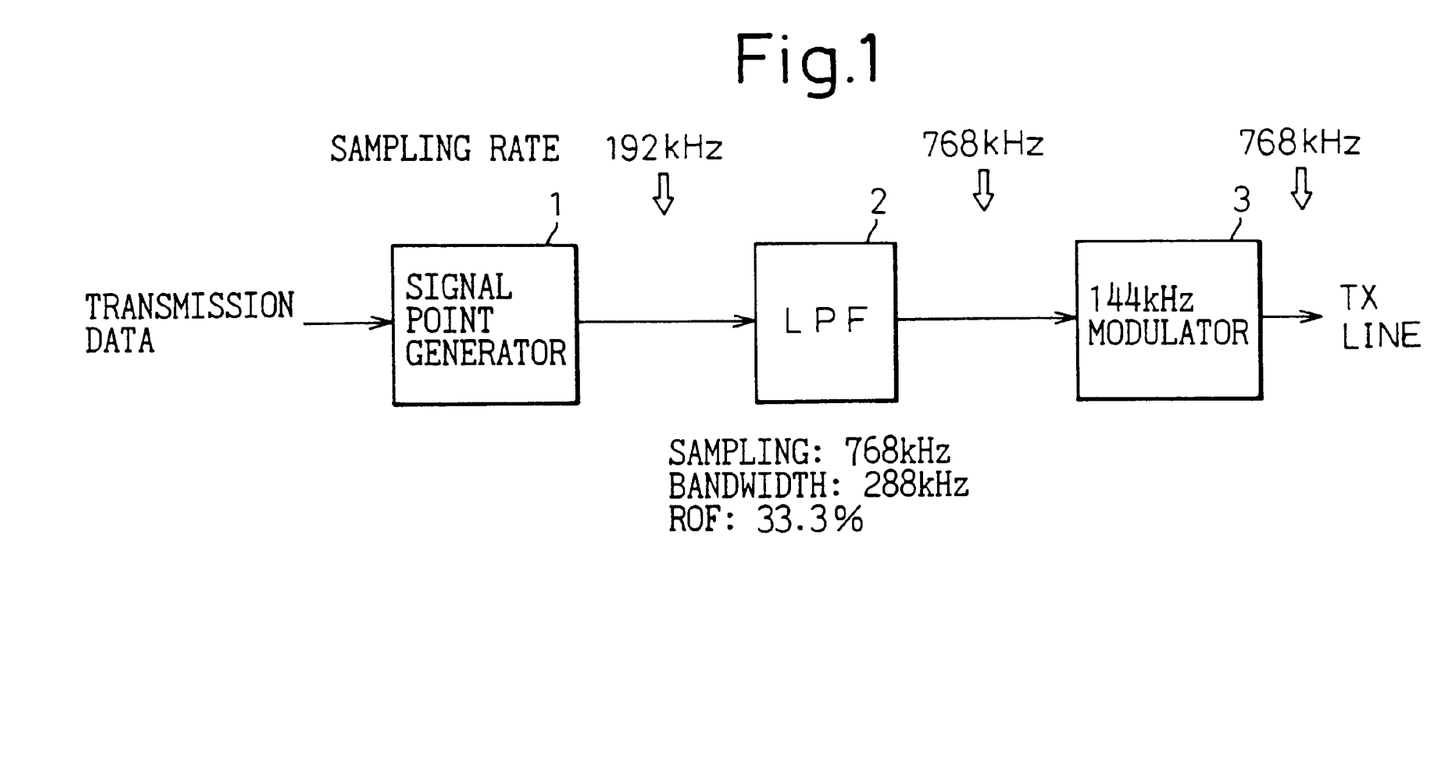
FIG. 1 is a diagram showing one configurational example of a modulation apparatus according to the prior art.
Figure 2A:
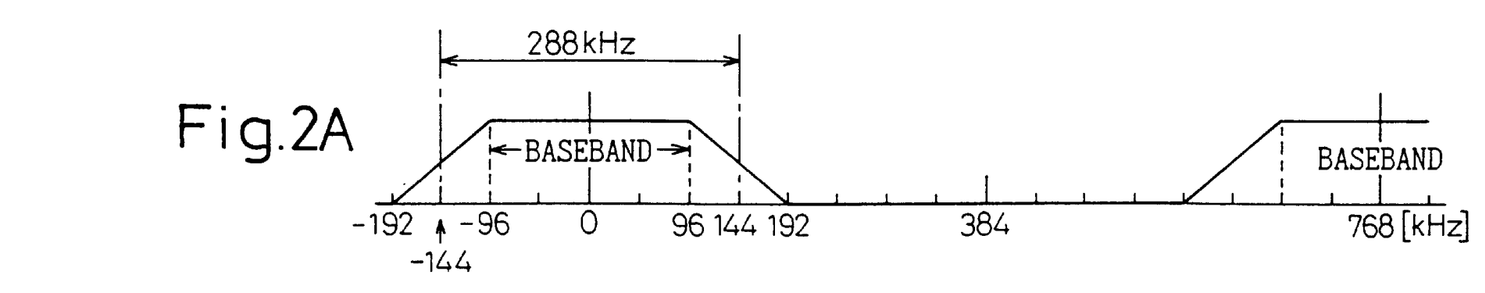
FIGS. 2A, 2B, and 2C are diagrams showing the frequency spectra of output signals of the constituent blocks shown in FIG. 1.
Figure 2B:
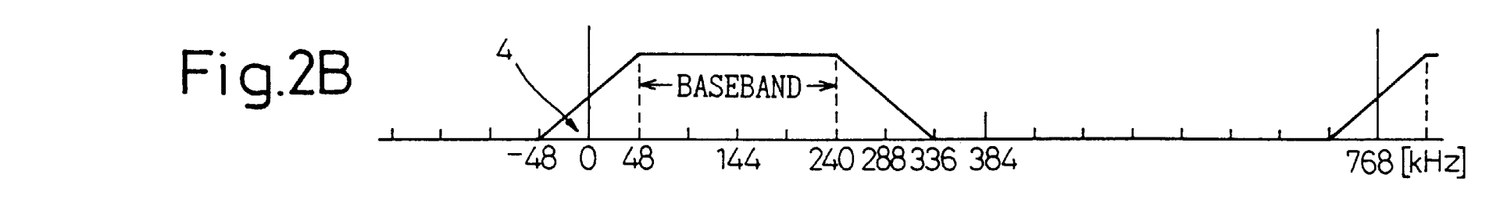
Figure 2C:
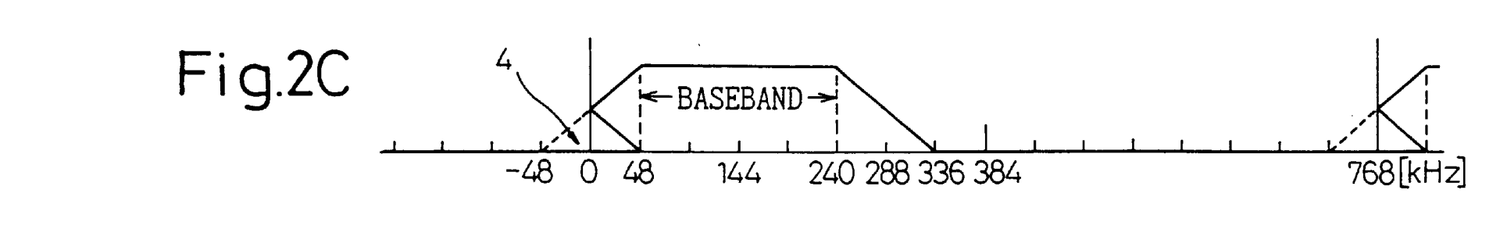

To facilitate understanding of the principles and embodiments of the present invention, a detailed description of the prior art will be given first. FIG. 1 is a diagram showing one configurational example of a modulation apparatus according to the prior art, and FIGS. 2A, 2B, and 2C are diagrams showing the frequency spectra of output signals of the respective constituent blocks shown in FIG. 1. The constituent blocks of FIG. 1 are implemented in firmware within a digital signal processor (DSP). First, in FIG. 1, a signal point generator 1 generates signal points (symbols), representing transmission data, at a symbol rate (also called the modulation rate or baud rate) of 192K baud.

A low-pass filter (LPF) 2, also called a waveshaping filter or a roll-off filter, performs interpolation to raise the sampling rate from 192 kHz to 768 kHz, while limiting the frequency band of the output signal of the signal point generator 1 to a 288-kHz band containing the baseband of 192-kHz width. The roll-off factor (ROF) at this time is 33.3%. The resulting frequency spectrum of the output signal of the LPF 2 is as shown in FIG. 2A. The roll off factor is a measure of the sharpness of the cutoff frequency characteristic of the roll-off filter 2, and takes a value within a range of 0 to 1, the sharpness decreasing with increasing roll off factor. In FIG. 2A, the roll off factor (ROF) is 33.3% in accordance with the calculation $$(192-144)/144=0.333$$

The modulator 3 samples the output of the LPF 2 at the sampling rate of 768 kHz, and shifts the frequency band of the output signal of the LPF 2 by 144 kHz using a carrier of 144 kHz. As a result, the output signal of the modulator 3 is a passband signal centered about the carrier frequency of 144 kHz, as shown in FIG. 2B. Since the signal actually output onto the transmission line is a scalar signal (real number), as previously noted, the negative value portion 4 shown in FIG. 2B is folded into the positive side, as shown in FIG. 2C. The roll off factor, the carrier frequency, etc. are appropriately determined so that the folded portion 4 does not overlap into the baseband.

To respond to the need for long-distance transmission using an in-building modem or a wideband modem, it is essential that the carrier frequency be set as low as possible to reduce signal attenuation and minimize energy loss at high frequencies, as previously described. For example, in the prior art modulation method employed in the configuration of FIG. 1, consider the case where the carrier frequency is simply lowered from 144 kHz to, for example, 108 kHz, while maintaining the roll off factor of the LPF2 at 33.3%.

Figure 3A:
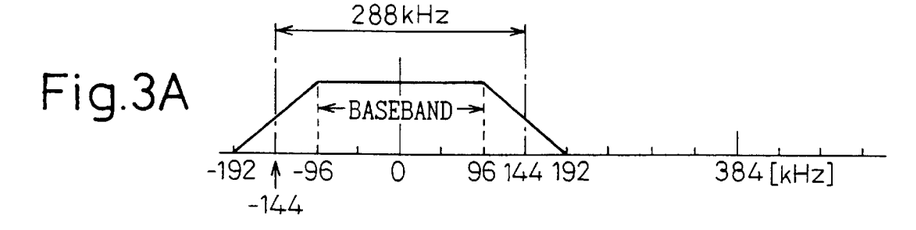
FIGS. 3A, 3B, 3C, and 3D are diagrams showing the frequency spectra of output signals of the respective blocks in the modulation apparatus of FIG. 1 when the carrier frequency in the modulator 3 is set at 108 kHz.

FIGS. 3A, 3B, 3C, and 3D are diagrams showing the frequency spectra of output signals of the respective blocks in the modulation apparatus of FIG. 1 when the carrier frequency in the modulator 3 is simply lowered to 108 kHz. Since the roll off factor (ROF) of the LPF 2 remains the same at 33.3% as in the case for the 144-kHz carrier frequency, the frequency spectrum of the output signal of the LPF 2, shown in FIG. 3A, is the same as that shown in FIG. 2A. Then, the modulator 3 samples the output of the LPF 2 at the sampling rate of 768 kHz, and shifts the frequency band of the output signal of the LPF 2 by 108 kHz using the 108-kHz carrier.

Figure 3B:
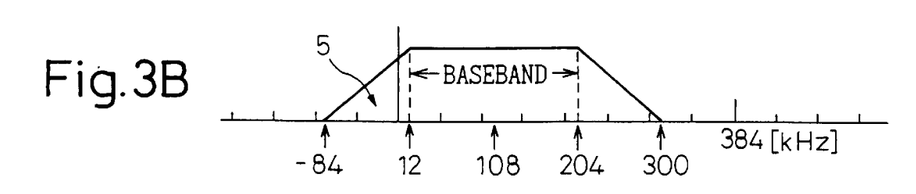

As a result, the output signal of the modulator 3 is a passband signal centered about the carrier frequency of 108 kHz, as shown in FIG. 3B.

Figure 3C:
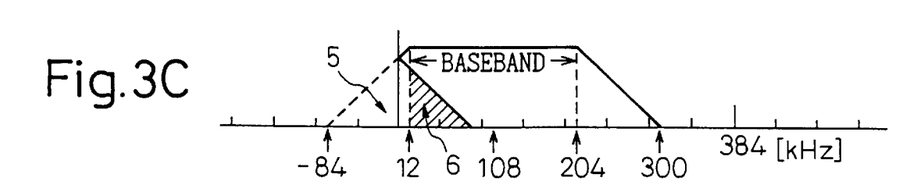

However, since the signal actually output onto the transmission line is a scalar signal (real number), as previously noted, the negative value portion 5 shown in FIG. 3B is folded into the positive side, as shown in FIG. 3C. In this case, of the folded portion 5, the portion indicated at 6 overlaps into the baseband; this overlapping causes noise and degrades the signal.

Figure 3D:
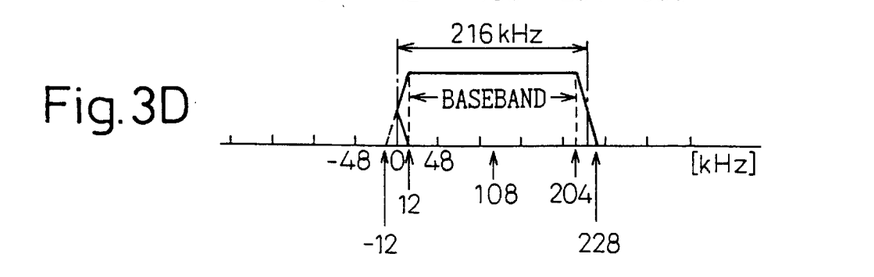

In this way, when realizing the carrier frequency of 108 kHz for the baseband bandwidth of 192 kHz, if the roll off factor remains at 33.3%, the problem of aliasing noise occurs. Therefore, the folded portion must be limited to within the range of ±12 kHz, as shown in FIG. 3D, in accordance with the calculation $$108-192/2=108-96=12$$

in order to prevent it from overlapping into the baseband. The limiting bandwidth of the LPF 2 in this case is 216 kHz in accordance with the calculation $$(96+12)\times2=216$$

Accordingly, the roll off factor necessary to achieve this is 11.1% in accordance with the calculation $$12/(216/2)=0.111$$

However, reducing the roll off factor increases the amount of computation in the DSP, as will be described below.

Figure 4:
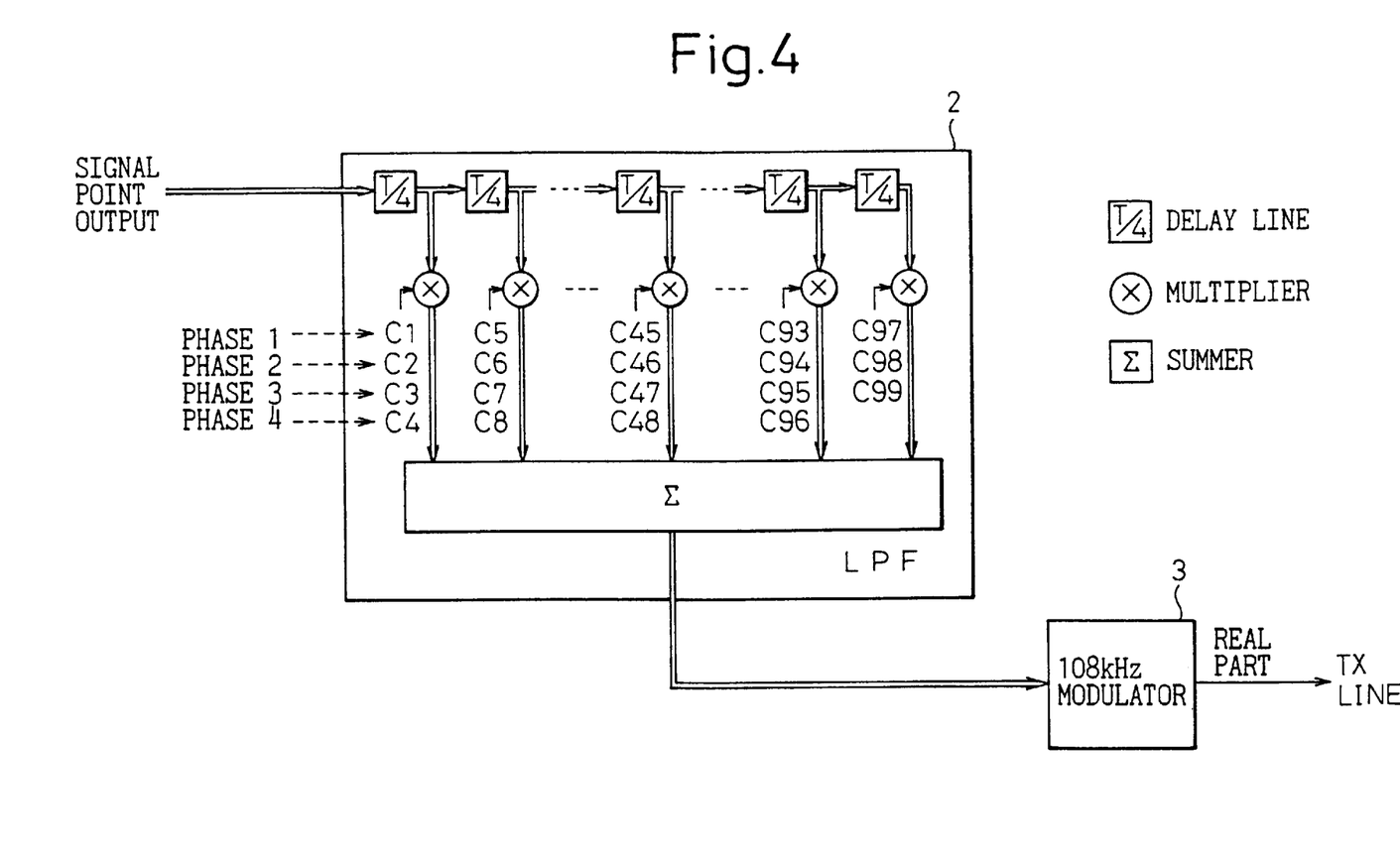
FIG. 4 is a diagram showing an equivalent circuit of a low-pass filter (digital filter) when the carrier frequency is set at 108 kHz in the prior art apparatus.

FIG. 4 is a diagram showing an equivalent circuit of the LPF 2 (digital filter) when the carrier frequency is set at 108 kHz in the prior art apparatus. As shown in the figure, the digital filter consists of delay lines, multipliers, and a summer. In the figure, T denotes the symbol interval (the reciprocal of the modulation rate of 192 kHz). Since the LPF 2 performs interpolation to quadruple the sampling rate from 192 kHz to 768 kHz, the delay lines of "T/4" are used and the multiplications by tap coefficients C1, C2, . . . C99 consisting of an impulse response sequence are grouped into four phases from phase 1 to phase 4.

The number of taps in a digital filter is related to the roll off factor; for example, when setting the roll off factor to 33.3%, as shown in FIGS. 2A to 2C, the required number of taps is 31, but when setting the roll off factor to 11.1%, as shown in FIG. 3D, the number of taps must be increased to 99, as shown in FIG. 4. Accordingly, if the carrier frequency is lowered in an attempt to achieve long-distance transmission by just extending the prior art modulation method, the amount of computation in the DSP will increase enormously.

Figure 5:
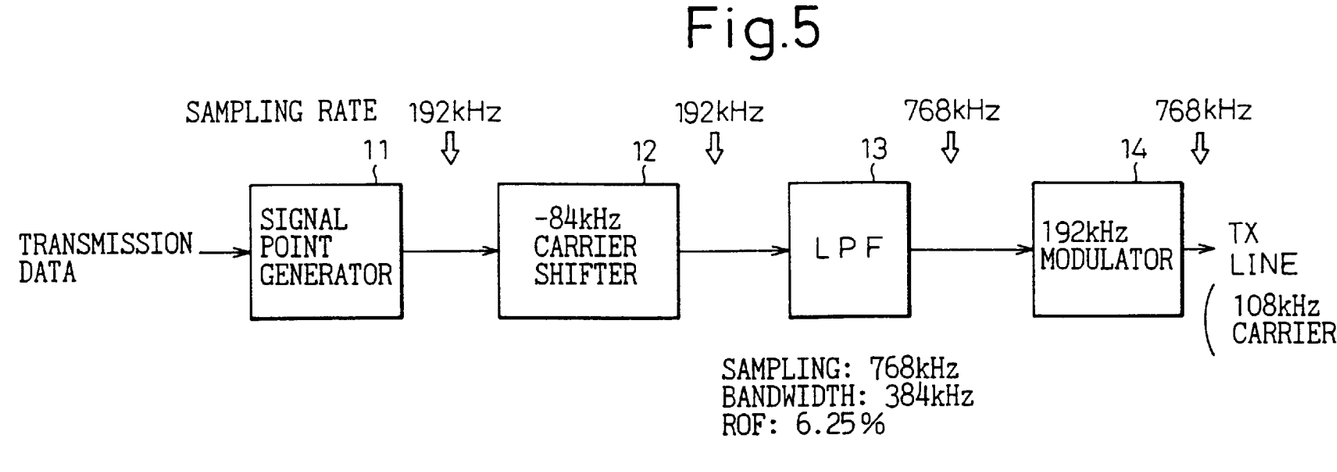
FIG. 5 is a block diagram showing the basic configuration of a modulation apparatus according to one embodiment of the present invention, in which the carrier frequency is set at 108 kHz.
Figure 6A:
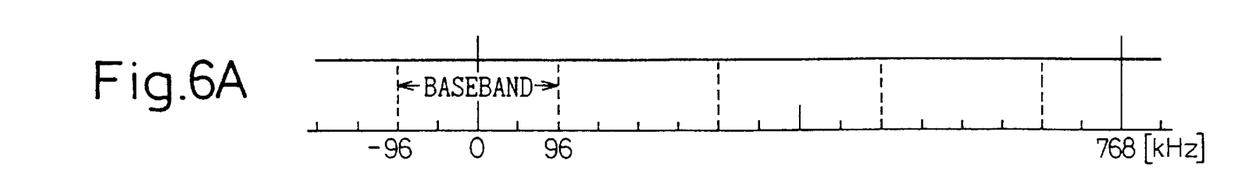
FIGS. 6A, 6B, 6C, and 6D are diagrams showing the frequency spectra of output signals of the respective blocks shown in FIG. 5.
Figure 6B:
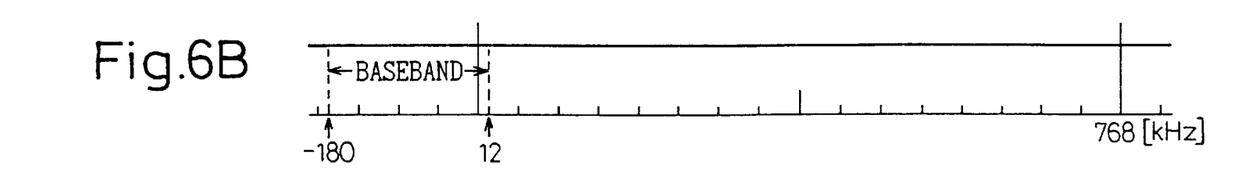
Figure 6C:
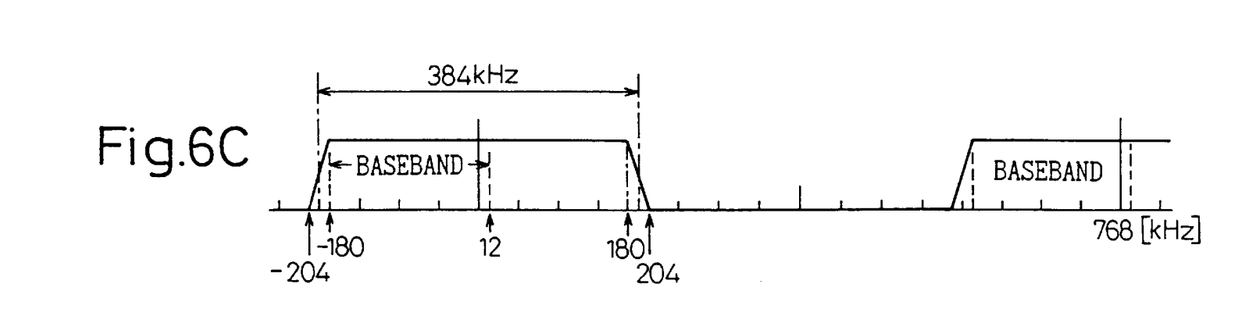
Figure 6D:
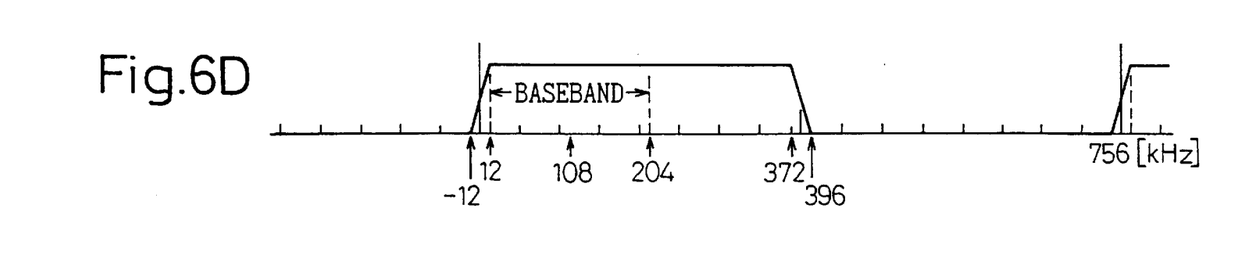
Figure 7:
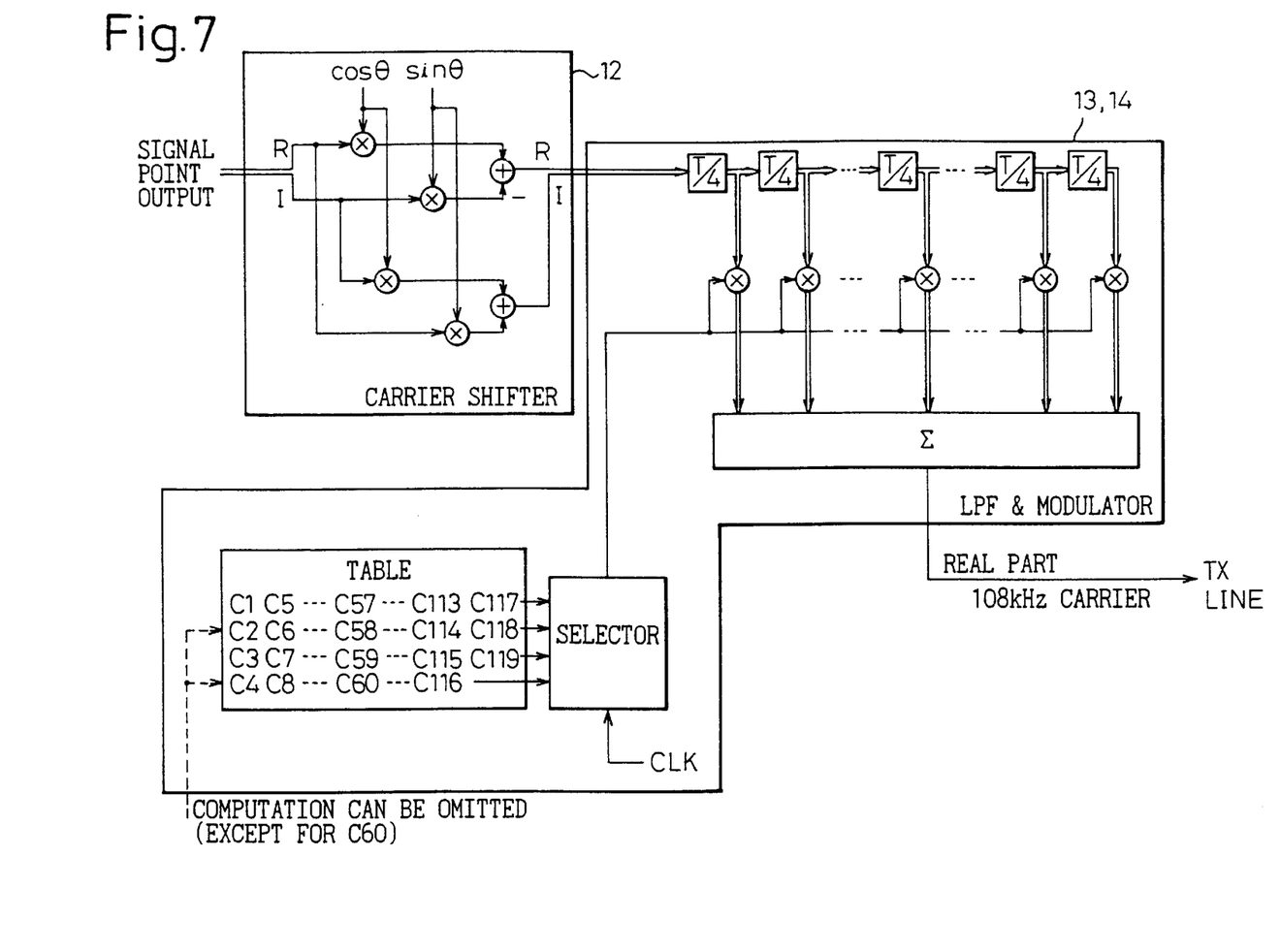
FIG. 7 is a block diagram showing the configuration of FIG. 5 in more detail.

FIG. 5 is a block diagram showing the basic configuration of a modulation apparatus according to one embodiment of the present invention, in which the carrier frequency on the transmission line is set at 108 kHz. FIGS. 6A, 6B, 6C, and 6D are diagrams showing the frequency spectra of output signals of the respective blocks in FIG. 5, and FIG. 7 is a block diagram showing the configuration of FIG. 5 in more detail.

The signal point generator 11 in FIG. 5, like the signal point generator 1 in FIG. 1, generates signal points, representing transmission data, at a modulation rate of 192 kHz. The frequency spectrum of its output signal is as shown in FIG. 6A, with the baseband having a bandwidth of 192 kHz centered about 0 kHz. A carrier shifter 12 as a first frequency shifting means shifts the frequency band of the output signal of the signal point generator 11 by a first frequency shift amount of −84 kHz. The frequency spectrum of its output signal is as shown in FIG. 6B. This frequency shift amount of −84 kHz corresponds to the difference between the sampling frequency of 192 kHz and the carrier frequency of 108 kHz.

An LPF 13 performs interpolation to raise the sampling rate from 192 kHz to 768 kHz, while limiting the frequency band of the output signal of the carrier shifter 12 to a frequency bandwidth of 384 kHz which is twice the modulation rate of 192 kHz and contains the baseband (192 kHz wide) of the output signal of the carrier shifter 12 (this means a cutoff frequency of 384 kHz). The frequency spectrum of its output signal is as shown in FIG. 6C. As can be seen from FIG. 6C, the roll off factor of the LPF 13 is 6.25% in accordance with the calculation (204×2−384)/384=0.0625

A modulator 14 as a second frequency shifting means shifts the frequency band of the output signal of the LPF 13 by a second frequency shift amount of 192 kHz which is one quarter of the sampling frequency of 768 kHz. The frequency spectrum of its output signal is as shown in FIG. 6D. As can be seen from FIG. 6D, the frequency shift amount of −84 kHz in the carrier shifter 12 and the frequency shift amount of 192 kHz in the modulator 14 combine to give a frequency of 108 kHz which is the frequency of the carrier actually output onto the transmission line.

A description will now be given of how the amount of computation can be reduced by the configuration of FIG. 5. Generally, frequency-shifting a function $G(f)$ in the frequency domain by $f_0$ to produce $G(f-f_0)$ means multiplying the corresponding function $g(t)$ in the time domain by $\exp[j\theta]$ (where $\theta=2\pi f_0 t$) to produce $g(t)\cdot\exp[j\theta]$. In the modulator 14, the frequency is shifted by 192 kHz which is one quarter of the sampling frequency of 768 kHz; therefore, the computation involved eventually leads to multiplying the output, R+jI, of the LPF 13 by one of complex carrier values, $\exp[j0]$, $\exp[j\pi/2]$, $\exp[j\pi]$, or $\exp[j3\pi/2]$.

That is, the multiplier for the output, R+jI, of the LPF 13 is one of the following four phases.

| Phase | Multiplier |
| --- | --- |
| 1 | 1.0+j0.0 |
| 2 | 0.0+j1.0 |
| 3 | −1.0+j0.0 |
| 4 | 0.0+j1.0 |

Since the output of the modulator 14 consists only of the real part of the result of the multiplication, the output for each phase is as follows.

| Phase | Modulator Output |
| --- | --- |
| 1 | R |
| 2 | −I |
| 3 | −R |
| 4 | I |

In this way, the computation in the modulator 14 only involves manipulating the sign of the computation result supplied from the LPF 13; as a result, the computation in the LPF 13 and the computation in the modulator 14 can be combined, as shown in FIG. 7, thus achieving a reduction in the amount of computation.

In the LPF 13 also, since the limiting bandwidth (i.e., the cutoff frequency) is 384 kHz which is twice the modulation rate of 192 kHz, and interpolation by a factor of 4 is performed, the sampling rate of 768 kHz is set at twice the limiting bandwidth of 384 kHz. Denoting the limiting bandwidth by $1/\tau$, the impulse response of the roll-off filter becomes 0 when $t=\pm n\tau$ (n=1, 2, 3, . . . ), and also, the tap coefficients are expressed as an impulse response sequence. Accordingly, for the tap coefficients of the LPF 13, zero points are generated for every other tap from the center tap.

In the block diagram of FIG. 7, the tap coefficients C1, C2, . . . , C119 stored in a table are read out through a selector by application of a prescribed clock CLK, that is, C1, C5, . . . , C117 are read out in phase 1, C2, C6, . . . , C118 in phase 2, C3, C7, . . . , C119 in phase 3, and C4, C8, . . . , C116 in phase 4. However, as described above, the coefficients C2, C6, . . . , C118 in phase 2 are actually all zero, and the coefficients C4, C8, . . . , C116 also are all zero except for the center tap coefficient C60. Since computations are not necessary for the taps with tap coefficients of zero, the computational burden of the DSP is greatly reduced.

Hence, the output of the modulator is as follows.

| Phase | Modulator Output |
| --- | --- |
| 1 | R |
| 2 | 0 |
| 3 | −R |
| 4 | I (center tap only) |

As can be easily understood from the above explanation, the carrier shifter 12 is provided to compensate for the setting of the carrier frequency at 192 kHz in the modulator 14. That is, with frequency shifting by −84 kHz in the carrier shifter 12, the output signal after frequency shifting by 192 kHz in the modulator 14 has the carrier frequency of 108 kHz that should be output onto the transmission line (TX LINE).

The computation in the carrier shifter 12 involves multiplying the output, R+jI, of the signal point generator 11 by the complex carrier $\exp[j\theta]$ (where $\theta=2\pi ft$, f=−84 kHz), and is written as $(R+jI)\cdot(\cos\theta+j\sin\theta)=(R\cos\theta-I\sin\theta)+j(R\sin\theta+I\cos\theta)$ The configuration of the carrier shifter 12 in the block diagram of FIG. 7 illustrates the above computation.

Figure 8:
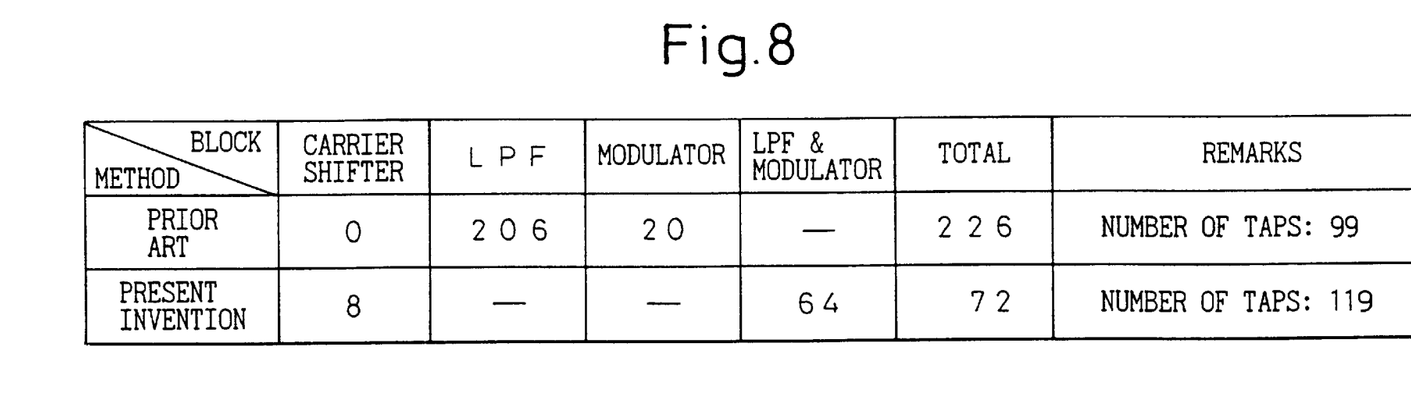
FIG. 8 is a diagram showing the amount of processing when modulation with the carrier frequency of 108 kHz is accomplished using a DSP in accordance with the method of the present invention by comparison with the prior art method.

FIG. 8 is a diagram showing the DSP processing amount when the modulation with the carrier frequency of 108 kHz on a transmission line is accomplished using the DSP in accordance with the method of the present invention by comparison with the prior art method. As can be seen from FIG. 8, the present invention achieves a reduction in the processing amount of the order of 154 cycles or about 70% compared with the prior art method.

Figure 9:
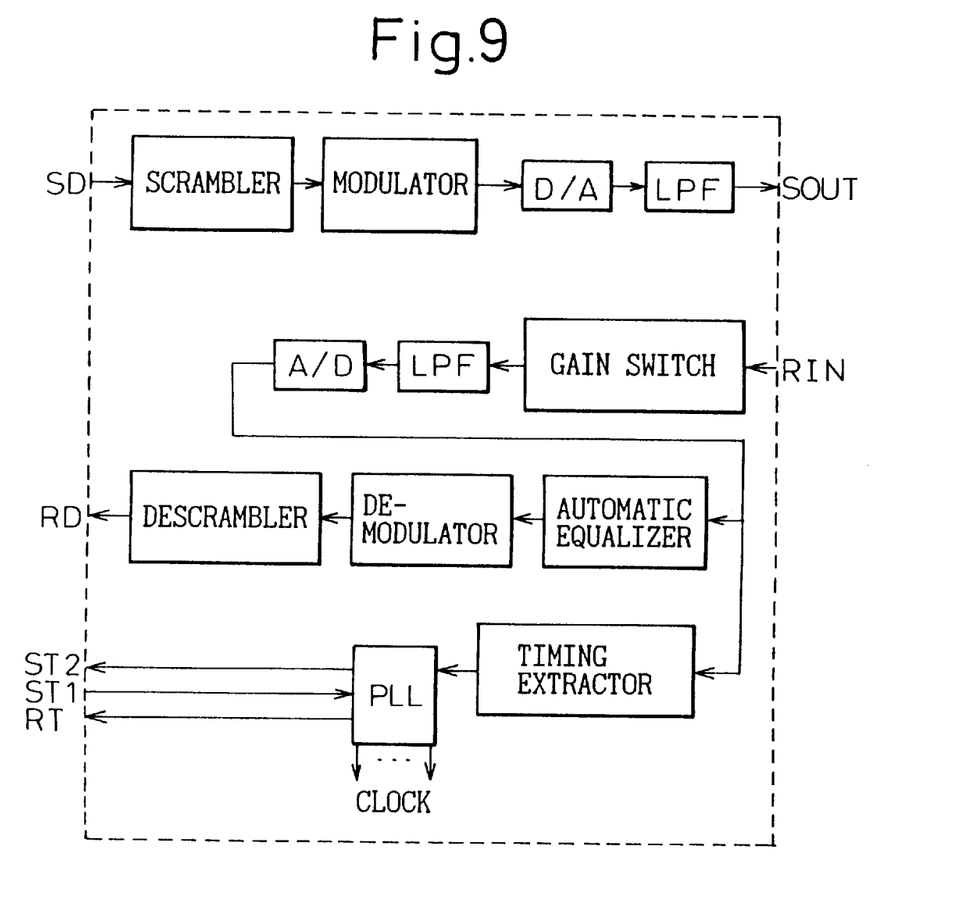
FIG. 9 is a block diagram showing one example of a data modem configuration incorporating the modulation apparatus of the present invention.

FIG. 9 is a block diagram showing one example of a data modem configuration incorporating the modulation apparatus of the present invention. In the figure, the constituent elements other than the modulation apparatus, that is, the scrambler, D/A converter, low-pass filter (LPF), gain switch, A/D converter, automatic equalizer, demodulator, descrambler, timing extractor, PLL circuit, etc. are the same as those used in a conventional modem.

As described above, according to the present invention, there are provided a modulation method and apparatus capable of achieving a desired carrier frequency, including a reduction in the carrier frequency, without increasing the amount of computation.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency to the claims are therefore intended to be embraced therein.

What is claimed is:

1. A modulation method in which the frequency band of a transmission signal, consisting of signal points generated at a given modulation rate in accordance with transmission data, is shifted by a desired frequency shift amount, comprising the steps of:

(a) shifting the frequency band of said transmission signal by a first frequency shift amount;
   (b) low-pass filtering an output signal resulting from said step (a) in order to limit said output signal to a frequency band containing baseband and equivalent to an integral multiple of said modulation rate; and
   (c) shifting the frequency band of an output signal resulting from said step (b) by a second frequency shift amount equivalent to an integral submultiple of a sampling frequency, and wherein:
      said first frequency shift amount is set so that the sum of said first frequency shift amount and said second frequency shift amount is equal to said desired frequency shift amount.

2. A modulation method as claimed in claim 1, wherein said step (b) performs interpolation by a factor equivalent to an integral multiple of said second frequency shift amount.

3. A modulation method as claimed in claim 1, wherein said steps are each implemented within a digital signal processor.

4. A modulation method as claimed in claim 1, wherein processing in said step (b) and processing in said step (c) are combined together and carried out as a single digital computational process.

5. A modulation method for modulating a transmission signal by using a carrier having a prescribed frequency, comprising the steps of:

frequency-shifting said transmission signal by a first frequency; and
   modulating said frequency-shifted transmission signal by using a signal having a second frequency, and wherein:
   said first frequency is set at a value obtained by subtracting said prescribed frequency from said second frequency.

6. A modulation method as claimed in claim 5, wherein said signal frequency-shifted by said first frequency is filtered with a low-pass filter having a cutoff frequency equal to an integral multiple of said second frequency.

7. A modulation apparatus for shifting by a desired frequency shift amount the frequency band of a transmission signal consisting of signal points generated at a given modulation rate in accordance with transmission data, comprising:

first frequency shifting means for shifting the frequency band of said transmission signal by a first frequency shift amount;
   a low-pass filter for limiting an output signal of said first frequency shifting means to a frequency band containing baseband and equivalent to an integral multiple of said modulation rate; and
   second frequency shifting means for shifting the frequency band of an output signal of said low-pass filter by a second frequency shift amount equivalent to an integral submultiple of a sampling frequency, and wherein:
   said first frequency shift amount is set so that the sum of said first frequency shift amount and said second frequency shift amount is equal to said desired frequency shift amount.

8. A modulation apparatus as claimed in claim 7, wherein said low-pass filter performs interpolation by a factor equivalent to an integral multiple of said second frequency shift amount.

9. A modulation apparatus as claimed in claim 7, wherein said first frequency shifting means, said low-pass filter, and said second frequency shifting means are implemented within a digital signal processor.

10. A modulation apparatus as claimed in claim 7, wherein said low-pass filter and said second frequency shifting means are combined together and implemented as a single digital computational processing means.

11. A modem equipped with a modulation apparatus for shifting by a desired frequency shift amount the frequency band of a transmission signal consisting of signal points generated at a given modulation rate in accordance with transmission data, said modulation apparatus comprising:

first frequency shifting means for shifting the frequency band of said transmission signal by a first frequency shift amount;
   a low-pass filter for limiting an output signal of said first frequency shifting means to a frequency band containing baseband and equivalent to an integral multiple of said modulation rate; and
   second frequency shifting means for shifting the frequency band of an output signal of said low-pass filter by a second frequency shift amount equivalent to an integral submultiple of a sampling frequency, and wherein:
   said first frequency shift amount is set so that the sum of said first frequency shift amount and said second frequency shift amount is equal to said desired frequency shift amount.

* * * * *